United States Patent [19]

Groeschner

[11] Patent Number: 4,512,362

[45] Date of Patent: Apr. 23, 1985

[54] PNEUMATIC CONTROL VALVE MANIFOLD INTERFACE

[75] Inventor: Donald L. Groeschner, New Milford, Conn.

[73] Assignee: The Perkin-Elmer Corporation, Norwalk, Conn.

[21] Appl. No.: 444,563

[22] Filed: Nov. 26, 1982

[51] Int. Cl.³ ............................................. F16K 11/24
[52] U.S. Cl. ............................... 137/356; 137/624.11; 137/561 R; 137/884
[58] Field of Search .................... 137/884, 270, 596.17, 137/624.11, 356, 561 R; 251/367

[56] References Cited

U.S. PATENT DOCUMENTS

| | | | |
|---|---|---|---|
| 3,785,389 | 1/1974 | Friedland | 137/884 X |
| 3,957,079 | 5/1976 | Whiteman | 137/884 X |
| 4,084,615 | 4/1978 | Klein | 137/624.11 |
| 4,130,137 | 12/1978 | Lane | 137/884 |

*Primary Examiner*—Alan Cohan
*Attorney, Agent, or Firm*—Thomas P. Murphy; Edwin T. Grimes; F. L. Masselle

[57] ABSTRACT

A pneumatic control assembly comprising a plurality of control valve printed circuit board pneumatic connectors disposed in a card cage in communication with a like number of control logic manifolds fixed to the card cage. The control logic manifolds are programmed to provide the actual control functions to the associated apparatus thereby permitting the conrol valve printed circuit board pneumatic connectors to be identical.

10 Claims, 10 Drawing Figures

PNEUMATIC CONTROL VALVE MANIFOLD INTERFACE

BACKGROUND OF THE INVENTION

An important consideration in the design of high technology equipment is the ease of service and maintenance of the equipment once it is placed in its operational environment. Therefore, almost without exception all equipment involving complex electronic circuitry utilize modular construction techniques wherein much of the circuitry whether purely electronic or various hybrids thereof comprise printed circuit boards mounted in card cages. The card cages which may be integral parts of the equipment to be controlled contain a plurality of printed circuit boards. The printed circuit boards are easily removed from the card cages for servicing. In most cases the serviceman may simply replace the defective circuit board with a new one and return the defective one for repair at a service center. Thus, the equipment is serviceable with a minimum of down time.

A disadvantage of such construction is that each printed circuit board contains completely different circuitry from the other cards in the cage and must be replaced with one that is identical.

BRIEF SUMMARY OF THE INVENTION

The present invention overcomes the above disadvantage by providing a structure wherein each of the printed circuit boards in a card cage is identical. Thus, the printed circuit boards are interchangeable. This greatly increases the efficiency and economy of servicing inasmuch as a serviceman is only required to carry identical printed circuit boards and not one of each of a variety of different printed circuit boards. In addition, cost to the manufacturer is greatly reduced inasmuch as he is required only to build and maintain an inventory of the same printed circuit board.

In particular, the present invention relates to a pneumatic control system wherein certain functions within a system, e.g., a plasma etching system, are pneumatically controlled. Such a system employs one or more card cages which are permanent parts of the machine under control. Each card cage has disposed therein a plurality of identical control valve printed circuit board pneumatic connectors. Each of these control valve printed circuit board pneumatic connectors pneumatically interfaces with individual control logic manifolds fixed to the back of the card cage. Each of the control logic manifolds are programmed to provide the required pneumatic functions to the machine in response to the state of energization of valves mounted on the control valve printed circuit board pneumatic connector.

DESCRIPTION

Figure 1:
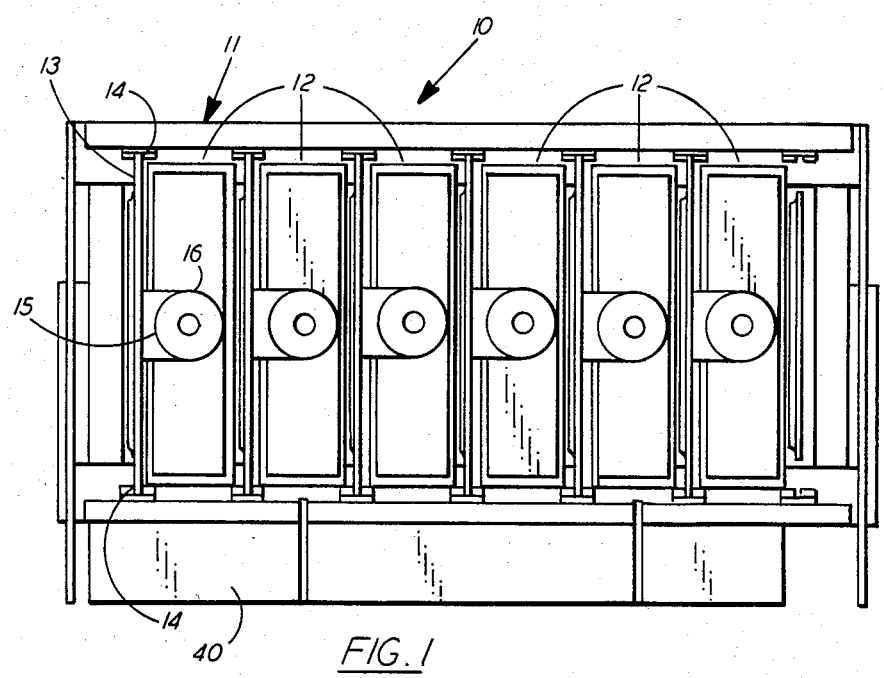
FIG. 1 is a frontal view of the card cage of the present invention with the control valve printed circuit boards pneumatic connectors in place.

FIG. 1 shows a typical card cage assembly 10 used in the present invention. It comprises a frame 11 forming a plurality of slots 12 into which control valve printed circuit board pneumatic connectors 13 are inserted. Each of the control valve printed circuit board pneumatic connectors 13 comprises a printed circuit board 18. The printed circuit boards 18 are guided, e.g., via grooves 14 fixed to the frame 11 and are fixed in place by means of a shaft 15 fixed to the circuit board and screwed into the back board of the frame by turning knobs 16. The backboard of the card cage 11 contains the electrical and pneumatic structure which interfaces with the apparatus which is to be controlled. The card cage 10 is shown having six slots for receiving circuit boards but it should be noted that it could contain more or less depending on the particular functions required. The card cage assembly thus far described is of a conventional type but has been described as an aid in understanding the present invention.

Figure 2:
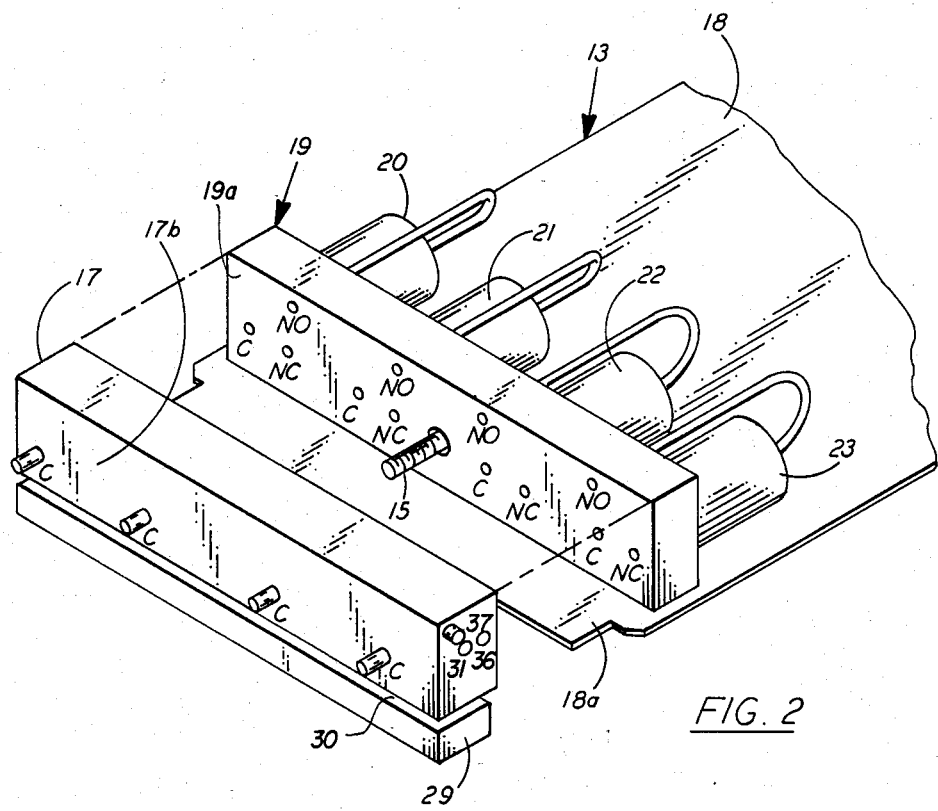
FIG. 2 is a pictorial representation of a control valve printed circuit board pneumatic connector and its associated control logic manifold.

FIG. 2 is a pictorial illustration of a control valve printed circuit board pneumatic connector 13 shown in association with a control logic manifold 17. Each slot 12 in the card cage 10 would contain such a control valve printed circuit board pneumatic connector with a control logic manifold 17. There is a control logic manifold 17 for each of the control valve printed circuit board pneumatic connectors 13. Each of the control manifolds 17 is appropriately fixed to the back plate 40 of the card cage.

As aforesaid, each control valve printed circuit board pneumatic connector 13 comprises a printed circuit board 18. Mounted on the printed circuit board 18 is a pneumatic connector 19. The pneumatic connector 19 is made of any convenient material, e.g., aluminum alloy. Also mounted on the circuit board 18 and secured to pneumatic connector 19 are four solenoid operated valves 20, 21, 22 and 23. Each of the valves 20, 21, 22 and 23 has three ports, a normally open port NO, a normally closed port NC and a common port C.

All of the valves, 20, 21, 22 and 23 are identically structured and each communicates through the pneumatic connector 19, i.e., each normally open port NO, normally closed port NC, and common port C extend through the pneumatic connector 19 and terminates at the face 19a of pneumatic connector 19.

The printed circuit board 18 carries the circuitry for activating each of the valves 20, 21, 22 and 23. The valves 20, 21, 22 and 23 may be energized by a computer programmed in accordance with the sequence of pneumatic control functions required to operate the associated apparatus. Neither the computer, the apparatus controlled nor the electronics on each circuit board for operating each of the valves 20, 21, 22 and 23 form part of the present invention and, therefore, are not shown. The essential feature of the present invention is the interchangeability of the control valve printed circuit board pneumatic connectors 13 made possible by incorporating all the pneumatic logic in their associated control logic manifolds.

Figure 3:
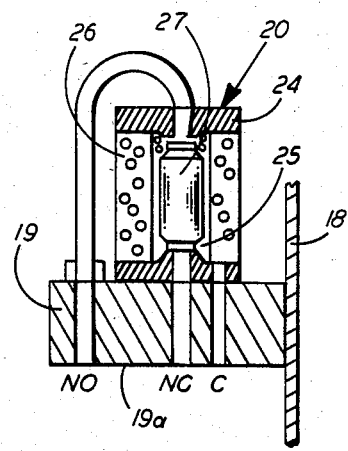
FIG. 3 is a detailed sectional view of one of the valves mounted on the control valve printed circuit board pneumatic connector shown in FIG. 2.

As best seen in FIG. 3, each solenoid operated valve, e.g., valve 20 comprises a spool 24 forming a chamber 25. An energizing coil 26 is disposed about the spool 24. In its unenergized state solenoid poppet valve 27 is spring biased to maintain normally closed port NC closed with normally open port NO communicating via chamber 25 with common port C. When the valve is energized by applying current to coil 26 this situation is reversed causing normally open port NO to close and normally closed port NC to open connecting it with the common port C via chamber 25. The valve 20 maintains this state as long as it is energized.

The valve 20 is fixed to pneumatic connector 19 which in turn is fixed to printed circuit board 18. As can be seen the normally closed port NC, the common port C and the normally open port extend through pneumatic connector 19 terminating at its face 19a.

Figure 4:
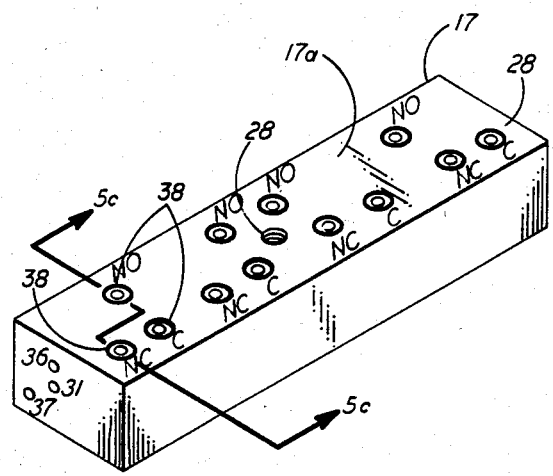
FIG. 4 is a pictorial representation of a control logic manifold.

Referring to FIGS. 2 and 4 it is seen that control logic manifold 17 has on its face 17a ports which are complimentary to each of the ports on the face 19a of pneumatic connector 19 for each of the four solenoid operated valves 20, 21, 22 and 23.

Thus, it can be seen that when control valve printed circuit board pneumatic connector 13 is inserted in a slot 12 of the card cage 10 and secured by screwing the threaded end of shaft 15 into internally threaded opening 28 each normally open port NO, normally closed port NC and common port of pneumatic connector 19 communicates only with their respective ports on the control logic manifold 17. These connections are made air tight by use of O-rings 29 inserted in grooves on the face 17a of control logic manifold 17.

Fixed to the back plate 40 of the card cage 10 is a printed circuit board connector 29 which forms a slot 30 into which tab 18a is inserted. The tab 18a contains the busses (not shown) which make the electrical connection with printed circuit board connector 29 supplying each printed circuit board 18 with the appropriate signals for energizing the solenoid operated valves 20, 21, 22, and 23. There is a printed circuit board connector 29 fixed to back plate 40 along with an associated control manifold 17 which together form slots 30 for receiving each of the tabs 18a of each printed circuit board 18.

As aforesaid the control logic manifold 17 associated with each control valve printed circuit board pneumatic connector 13 contains the logic, i.e., is programmed to provide the pneumatic control function called for in the apparatus desired to be controlled. This permits each control valve printed circuit board pneumatic connector 13 to be identical which greatly increases efficiency of servicing and lowers manufacturing and inventory expense.

The control logic manifold 17 may be programmed to perform different functions within its associated apparatus. For each solenoid 20, 21, 22 and 23, e.g., the control logic manifold 17 may be programmed differently or the same depending on the control function called for by the apparatus to be controlled.

This is accomplished by three channels 31, 36 and 37 drilled or otherwise formed in the length of the control logic manifold 17. These are then caused to be connected to the normally open port NO, or the normally closed port NC in the control logic module 17 in the manner required for particular pneumatic control function. The common port is always connected to the apparatus to be controlled.

FIGS. 5a–5f show six possible variations in the way one of 4 sections of the control logic manifold 17 may be programmed. Each control logic manifold 17 may have four different program arrangements or some or all four may be the same.

Two of the channels 31, and 36 are connected to sources of air pressure and vacuum. The remaining channel 37 is connected to vent or exhaust.

Figure 5A:
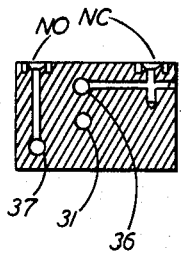
FIGS. 5a–5f show various programming configurations for the control logic manifold.
Figure 5B:
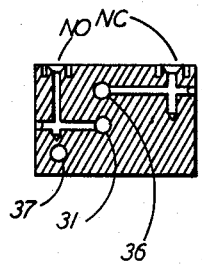
Figure 5C:
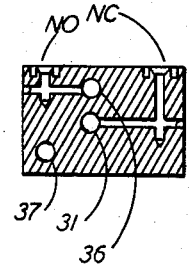
Figure 5D:
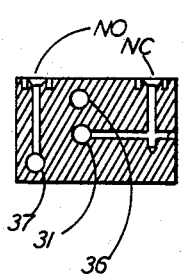
Figure 5E:
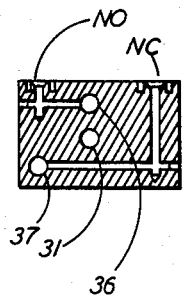
Figure 5F:
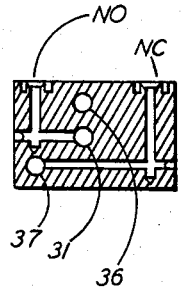

FIG. 5c which is a view taken through section 5c—5c of the control logic manifold 17 illustrated in FIG. 4 shows a typical program arrangement of a portion of the control logic manifold 17 associated with one of the solenoid operated valves. As seen, the normally open port NO is connected to channel 36 which, for example, may be connected to a source of vacuum. Normally closed port NC is connected to channel 31 which may, for example, be connected to the source of air pressure. Therefore, common port C is normally connected to the source of vacuum. However, when the associated solenoid operated valve 20, 21, 22, or 23 is actuated the common port C is disconnected from the source of vacuum and connected to the source of air pressure while the associated valve remains energized.

FIGS. 5a, 5b, 5d, 5e and 5f show different program arrangements which are similar in concept to the arrangement described with reference to FIG. 5c.

The common port C is the one connected into the associated apparatus which is to be pneumatically controlled. These are shown as extensions of ports C on face 17b of control logic manifold 17. Face 17b interfaces, with the apparatus to be pneumatically controlled, with the common ports C of the solenoid valve.

Thus, it is seen that card cage 10 which has six slots can support 6 control logic manifolds each of which has four sections with each one of those four sections controlled by a single three way solenoid operated valve. By incorporating all control logic in the control logic manifolds 17, it is possible to use identical control valve printed circuit board pneumatic connectors 13 to provide an almost unlimited number of control functions for the associated apparatus.

Other modifications of the present invention are possible in light of the above description which should not be interpreted as placing limitations on the invention other than those limitations set forth in the claims which follow:

What is claimed is:

1. In a pneumatic control system for providing control functions to an associated apparatus,
    a card cage having having a back plate and a plurality of card slots permanently fixed to said apparatus,
    a like plurality of control logic manifolds fixed to said back plate for respective ones of said card slots,
    each of said control logic manifold being individually pneumatically programmed to perform specific control functions,
    a like plurality of identical control valve printed circuit board pneumatic connectors removably disposed in each of said card slots in pneumatic communication with respective ones of said control logic manifolds.

2. In a pneumatic control system according to claim 1 wherein each of said control valve printed circuit board pneumatic connectors comprises,
    a printed circuit board,
    at least one solenoid operated valve mounted on said printed circuit board,
    a pneumatic connector mounted on said printed circuit having a first face continguous to said solenoid operated valve pneumatically connecting said solenoid operated valve to said control logic manifold.

3. In a pneumatic control system according to claim 2 wherein, said solenoid operated valve includes a normally open port, a normally closed port and a common port, said common port connected to said normally open port when said valve is unactuated and to said normally closed port when said valve is actuated.

4. In a pneumatic control system according to claim 3 wherein, said pneumatic connector includes conduits extending through said first face and terminating at a second face for pneumatically connecting said normally open port, said normally closed port and said common port to said control logic manifold.

5. In a pneumatic control system according to claim 4 wherein, said control logic manifold includes ports pneumatically connected to said normally open port, said normally closed port, and said common port via said pneumatic connector with only said common port extending through said control logic manifold into said apparatus for controlling a function therein.

6. In a pneumatic control system according to claim 5 wherein said control logic manifold includes a face contiguous to said second face of said pneumatic connector pneumatically connected to said ports of said control logic manifold.

7. In a pneumatic control system according to claim 6 including means for securing said face of said control logic manifold against said second face of said pneumatic actuator and means for forming airtight fittings between the ports terminating at said second face of said pneumatic connector and the ports at the face of said control logic manifold.

8. In a pneumatic control system according to claim 5 wherein said control logic manifold includes, three channels extending through said control logic manifold, each of said three channels connected to a selected one of said ports in accordance with a predetermined program.

9. In a pneumatic control system according to claim 6 wherein said control logic manifold includes, three channels extending through said control logic manifold, each of said three channels connected to a selected one of said ports in accordance with a predetermined program.

10. In a pneumatic control system according to claim 7 wherein said control logic manifold includes, three channels extending through said control logic manifold, each of said three channels connected to a selected one of said ports in accordance with a predetermined program.

* * * * *